United States Patent
Morad

Patent Number: 5,083,085
Date of Patent: Jan. 21, 1992

[54] COMPACT SHIELDED GRADIENT COIL SYSTEM

[75] Inventor: Ratson Morad, Zichron Yaakov, Israel

[73] Assignee: Elscint Ltd., Haifa, Israel

[21] Appl. No.: 493,845

[22] Filed: Mar. 15, 1990

[30] Foreign Application Priority Data

Mar. 26, 1989 [IL] Israel .................................. 089743

[51] Int. Cl.⁵ .................................................. G01R 33/20
[52] U.S. Cl. ................................................................ 324/318
[58] Field of Search ........................ 324/318, 319, 320; 335/299, 301

[56] References Cited

U.S. PATENT DOCUMENTS

| | | | |
|---|---|---|---|
| 4,733,189 | 3/1988 | Punchard et al. | 324/318 |
| 4,737,716 | 4/1988 | Roemer et al. | 324/318 |
| 4,881,035 | 11/1989 | Siebold | 324/320 |
| 4,924,186 | 5/1990 | Kawamoto et al. | 324/320 |

*Primary Examiner*—Michael J. Tokar
*Attorney, Agent, or Firm*—Sandler, Greenblum & Bernstein

[57] ABSTRACT

A compact shield gradient coil system has a first set of gradient coils surrounded by a conducting shield. A second set of gradient coils is provided around the outside of the conducting shield. The first and second set of gradient coils and the conducting shield produce a linear gradient field inside the imaging volume and protect the imaging volume from interference, such as eddy current interference.

7 Claims, 1 Drawing Sheet

COMPACT SHIELDED GRADIENT COIL SYSTEM

FIELD OF THE INVENTION

The field of this invention relates to magnetic resonance imaging (MRI) and more specifically to systems for producing a linear gradient of the magnetic field in the imaging volume.

BACKGROUND OF THE INVENTION

Magnetic resonance imaging is a well established medical diagnostic method that achieves good resolution, especially at main magnetic fields of 0.5 Tesla and above. The main magnetic field is a static field which should be stable and homogeneous. In the majority of systems superconducting magnets are used but there are many systems that use resistive and permanent magnets especially for fields lower than 0.5 Tesla.

Since the resonance frequency of the nuclei is a function of the magnetic field strength, MRI techniques use field gradients in the magnetic field in order to provide a unique code for every point in the imaging volume. The gradient coils used to generate the field gradients usually have the form of cylinder for the Z direction gradient (axial) coil and a saddle or "stream function" form for the X and Y (transverse) direction gradient coils.

The gradient coils are energised by pulses. The changing magnetic field of the gradient coils induces currents in any proximate electrically conductive material. These induced currents or eddy currents distort the magnetic field in the imaging volume in both space and time, and consequently adversely affect the quality of the images.

One of the parameters that determines the cost and imaging ability of the main magnet system is the free bore diameter. Reducing the diameter of the free bore of the magnet increases the efficiency of the magnet in terms of cost and field strength. This is true for the magnets, whether they are super-conducting, resistive or permanent magnets.

One big benefit in reducing the diameter of the free bore of the magnet is that the volume enclosed in the 5 Gauss line (used to measure the magnetic interference volume) is decreased as well. Accordingly, problems associated with shielding and safety are much easier to overcome. The main drawback when reducing the diameter of the free bore is that there is a consequent increase in the eddy currents which adversely affect the magnetic field in the imaging volume.

In the prior art, there are two main solutions to the eddy current problems. The first is the use of a shield of conducting material which is placed between the gradient coil and the magnet. The shield protects the magnet system, but eddy currents are induced in this shield which still distort the main field in many instances, depending on the pulse sequence.

The second method is the use of an additional set of gradient coils which has a bigger diameter than the first set of gradient coils. The first set of coils produce a gradient field in the imaging volume, but also produce a magnetic field outside the coil. The second set of coils produces a field outside the coils which is equal to the field produced by the first set but in the opposite direction. The net result is that outside the gradient system the gradient field is very low. However, the field strength in the imaging volume is also reduced. In order to get the required field strength in the imaging volume the power in both sets of coils is increased.

A drawback with this approach is that in order to achieve good shielding, the radius of the outer set of coils needs to be much bigger than the radius of the first set of coils, and the free bore of the magnet cannot be reduced. Another drawback is an increase in the power required for the same gradient in the center of the imaging volume.

BRIEF DESCRIPTION OF THE INVENTION

It is an object of the present invention to protect the magnetic field in the imaging volume from distortions arising from eddy currents and to provide linear gradients in the imaging volume.

It is another object of the present invention to reduce the outside diameter of the gradient coil system, so that the free bore diameter of the magnet can be reduced to produce cost savings as well as to thereby reduce the stray field generated by the main magnet.

It is another object of the present invention to provide gradient coils having relatively strong mechanical structures.

According to one broad aspect of the present invention a compact shielded gradient coil system is provided for producing a linear gradient field inside the imaging volume and for protecting the imaging volume from interference arising from eddy currents occurring outside of the gradient system. The system includes a first set of coils having an inner radius of R0, and an outer radius of R1. A conducting shield surrounds the first set of coils. The conducting shield has an inner radius R2 preferably, equal to radius R1 and an outer radius R3. A second set of coils is provided having an inner radius R4 preferably equal to the radius R3 and an outer radius of R5. The first set of coils produces a gradient field in the imaging volume but also causes eddy currents in the conducting shield. The second set of coils produces eddy currents in the conducting shield which are in the opposite direction to the eddy currents produced by the first set of coils. The first and second set of coils and the conducting shield are adapted to produce a linear, protected gradient field inside the imaging volume both in the transient and steady states.

According to the broad aspect of the present invention at least coils of the second set are wound on the conducting shield to provide gradient coils having relatively strong mechanical structures.

BRIEF DESCRIPTION OF THE DRAWINGS:

The above mentioned and other features and objects of the present invention will be best understood by considering the following description of a preferred embodiment of the invention taken in conjunction with the accompanying drawings, wherein.

DETAILED DESCRIPTION OF THE INVENTION

Figure 1:
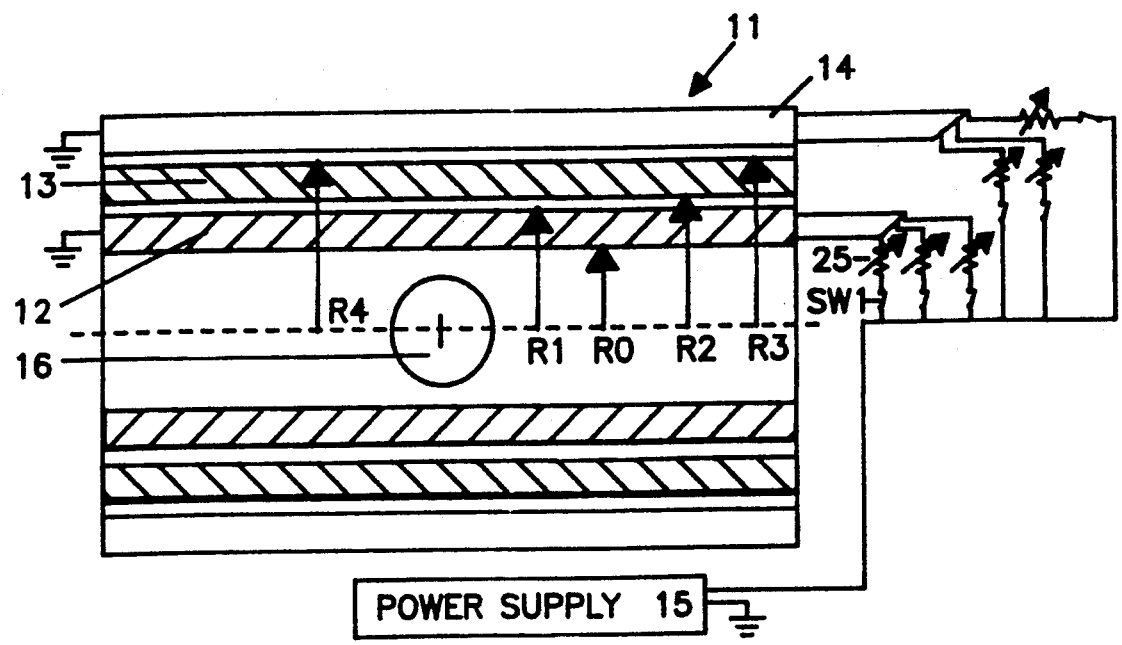
FIG. 1 is a cross-sectional view of a gradient system in accordance with the present invention.

The gradient system 11 of the present invention is shown in cross section in FIG. 1. A first set of coils 12 with inner radius R1 is coaxial with a conducting shield 13 with an inner radius R3. Both the first set of coils 12 and the shield 13 are coaxial, with a second set of coils 14 having an inner radius R5. The windings of the first set of coils 12 or the windings of the second set of coils 14 or the windings of both sets of coils, preferably are mounted on the conducting shield 13 which thus mechanically supports the coils, providing additional strength to the gradient system. Also, in a preferred embodiment each coil, the first set and the second set are connected to two outputs of the same power supply 15, so a single power supply can be used. Means, shown by way of example as variable resistors 25, are provided for driving each coil with a different current for different gradient sequences. Means to insure different time dependencies are also provided shown by way of example as switches SW1, controlled by the system controller (not shown).

When the first coil set is energised then a linear gradient field is produced in the imaging volume and eddy currents are also induced in the conducting shield. However, at the same time the second coil set is energised and induces eddy currents in the conducting shield in the opposite direction to those induced by the first set. The total effect on the imaging volume 16 at center of the field is a linear gradient. As the induced current in the conducting shield decays the current in both sets of coils is reduced and the linear gradient in the center field remains constant.

Figure 2:
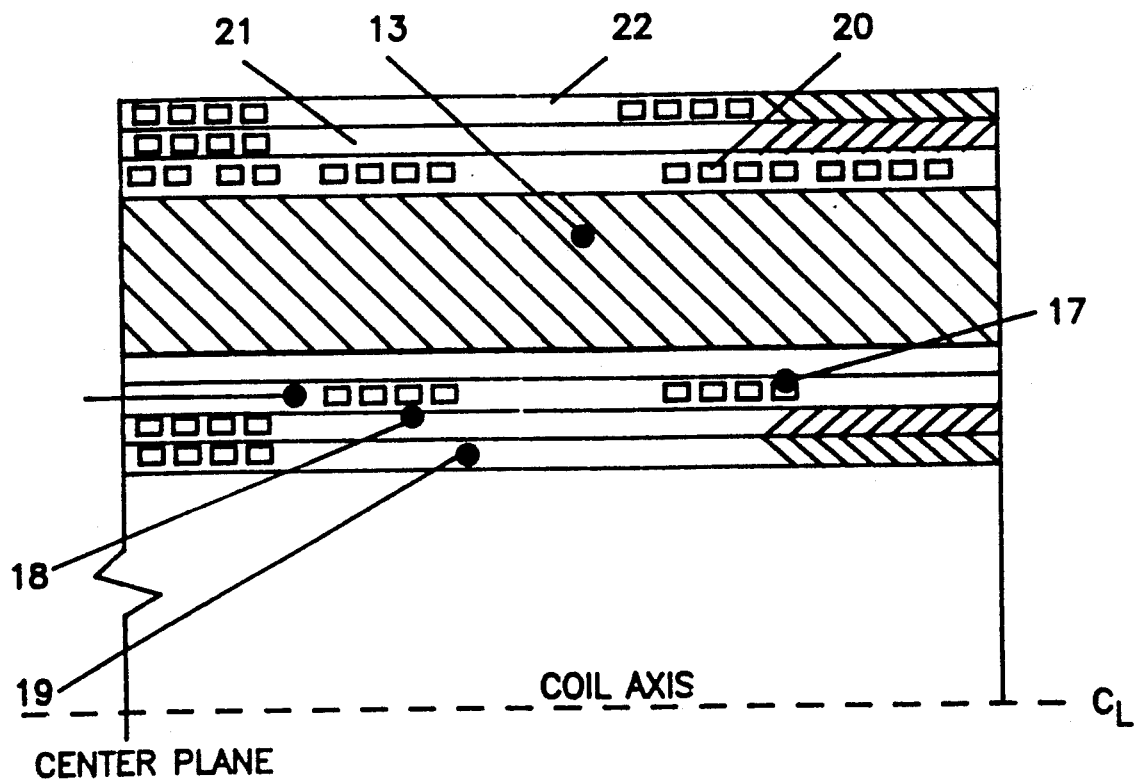
FIG. 2 is a more detailed cross-sectional view of a gradient system in accordance with the present invention.

The compact shielded gradient system shown in detail in FIG. 2 includes a first set of gradient coils comprising Z-gradient coil element 17, Y-gradient coil element 18 and X-gradient coil element 19. The Z-gradient coil elements are preferably implemented by solenoidal coils. The X and Y gradient coil elements are each preferably implemented by saddle or stream function coils. The conducting shield 13 which is preferably made of a high electrically conductive material, for example aluminium, is coaxial with the first coil set. The Z-gradient coil of the first set can be wound on the inner side of the conducting shield giving the coil set added mechanical strength.

The compact shielded system also includes a second set of gradient coils comprising Z-gradient coil element 20, Y-gradient coil elements 21 and X-gradient coil elements 22. The Z-gradient elements 20 are preferably implemented by a solenoidal coil, the X and Y gradient coil elements 21 and 22 are each preferably implemented by saddle or "stream function" coils.

The Z-gradient coil of the second set are preferably wound on the outer side of the conducting shield and may be on a machined glass reinforced plastic for insulation.

The inner set, the outer set and the conducting shield are assembled together so that in operation any eddy currents induced in the conducting shield by the first coil set will be supressed by opposite eddy currents from the second coil set giving substantially zero currents in the shield and linear gradients in the imaging volume. The inner coil is energised to produce the needed field in the imaging volume. Eddy currents which are induced in the shield are supressed by the eddy currents with an opposite direction, induced by the second set of gradient coils.

As the eddy currents in the conducting shield decay the current in the outer set are reduced. The effect of the outer set on the imaging volume is very small because of the conducting shield which protects the imaging volume from changes occurring outside of the shield. The net result is a savings in power compared to other solutions to the eddy current problem. The two sets of coils are designed and produced with small gaps therebetween, resulting in a smaller outer diameter for the shielded gradient. Therefore, a magnet with smaller bore can be used, providing a savings in cost for the magnet. In addition a reduction in the 5 gauss line is achieved.

While the invention has been described with reference to certain embodiments, it should be understood that the description is made by way of example only and not as a limitation on the scope of the invention.

What is claimed is:

1. A compact shielded gradient system for inclusion within the main field magnet of magnetic resonance (MR) systems, comprising:
    a first set of gradient coils,
    an electrically conducting shield extending around said first set of gradient coils and coaxial therewith,
    a second set of gradient coils surrounding the shield, and
    means for mounting the system within the main field magnet to provide an imaging volume with a linear gradient field and to protect the imaging volume from external eddy currents.

2. A compact shielded gradient system as in claim 1 wherein the first set of gradient coils is mounted to the conducting shield.

3. A compact shielded gradient system as in claim 1 wherein the second set is mounted to the conducting shield.

4. A compact shielded gradient system as in claim 1 wherein both the first and second set of gradient coils are mounted to the conducting shield.

5. The compact shielded gradient system of claim 1 wherein said first set of gradient coils produce a first set of eddy currents in said conducting shield and wherein said second set of gradient coils produce a second set of eddy currents in said conducting shield, said first set and said second set of eddy currents go in opposite directions.

6. The compact shielded gradient system of claim 1 wherein X, Y and Z gradient coils are provided to produce X, Y and Z gradients respectively, and wherein the z gradient coils are cylindrical and the X and Y gradient coils are saddle shaped.

7. The compact shielded gradient system of claim 2 wherein insulating material is used between the coil sets and the electrically conducting shield.

* * * * *